United States Patent
Arocha-Ferriño et al.

(10) Patent No.: US 8,338,722 B2
(45) Date of Patent: Dec. 25, 2012

(54) TAG ENCLOSING STRUCTURE

(75) Inventors: Victor-Manuel Arocha-Ferriño, Estado de Mexico (MX); Diana-Marisol Vázquez-Espinoza-De-Los-Monteros, Estado de México (MX); Emilio-Cuauhtémos Ruiz-Esparza-Flores, Monterrey (MX)

(73) Assignee: RFID Mexico, S.A. De C.V., San Pedro Garza Garcia N.L. (MX)

( * ) Notice: Subject to any disclaimer, the term of this patent is extended or adjusted under 35 U.S.C. 154(b) by 471 days.

(21) Appl. No.: 12/489,776

(22) Filed: Jun. 23, 2009

(65) Prior Publication Data

US 2009/0314542 A1 Dec. 24, 2009

Related U.S. Application Data

(60) Provisional application No. 61/074,842, filed on Jun. 23, 2008.

(51) Int. Cl.
*H01L 23/06* (2006.01)
(52) U.S. Cl. ..................................... 174/565
(58) Field of Classification Search .................. 174/565
See application file for complete search history.

(56) References Cited

U.S. PATENT DOCUMENTS

| | | | | |
|---|---|---|---|---|
| 6,255,949 | B1 * | 7/2001 | Nicholson et al. | 340/572.8 |
| 7,256,699 | B2 * | 8/2007 | Tethrake et al. | 340/572.8 |
| 2005/0194317 | A1 * | 9/2005 | Ikeyama et al. | 210/652 |
| 2008/0001762 | A1 * | 1/2008 | Baba et al. | 340/572.8 |
| 2009/0207027 | A1 * | 8/2009 | Banerjee et al. | 340/572.7 |

* cited by examiner

*Primary Examiner* — Timothy Thompson
*Assistant Examiner* — Hiram E Gonzalez
(74) *Attorney, Agent, or Firm* — Young & Thompson

(57) ABSTRACT

A RFID tag enclosing structure withstands temperatures $\leq 200°$ C. $\leq 90$ minutes; a maximum read operational temperature of 130° C.; water submersions $\leq 2$ m $\leq 2$ hours; contact with alkaline acids with pH of 4-13; contact with solvents; severe vibrations having acceleration $\leq 14.7$ g at 40 Hz in three directions $\leq 3$ hours; impacts at an acceleration of 6 g for 40 times minimum; a tension of 120 kg minimum; and flexing at 60 kg·cm. The RFID tag enclosing structure includes a main body made of a vulcanized thermoplastic elastomer having an internal housing ending in an open inferior recess having a surrounding wall protecting the open inferior recess. An RFID encapsulator structure completely surrounding a superior portion of the tag. The RFID tag surrounded by the RFID encapsulator structure is inside the main body internal housing.

8 Claims, 5 Drawing Sheets

TAG ENCLOSING STRUCTURE

BACKGROUND OF THE INVENTION

A. Field of the Invention

The present invention is related to RFID tag enclosing structures for protecting RFID tags from hostile industrial environments and more particularly to a RFID tag enclosing structure comprised of a ceramic fiber hardened on a resin having an external bell shaped cover made of vulcanized rubber B. Description of the Related Art In the industry, there are several productive processes in which the machinery, materials, tools, etc. need to be identified by RFID tags. One example of such application is in the automotive industry in which the basic vehicle chassises are identified with a RFID tag containing assembling data such as painting color, parts and accessories that comprise the vehicle, etc., so that when the vehicle is assembled in an automated production line, several RFID readers read said identification and the vehicle is automatically assembled in accordance with said information. As expected, the RFID chip must withstand hostile industrial environments, and in order to protect the chip from said environments, it is typically protected by an enclosing structure which is typically comprised by an internal dielectric gel layer covering the RFID chip and battery contained on a plastic cylinder which is surrounded by clay and glass fiber paper and is separated from the antenna at a distance of approximately 1".

One of the most severe environments of the vehicle assembling process is the painting stage, at which the vehicle being assembled is submitted to shocks, several baths of acid and several layers of paint are applied and treated at high temperatures in drying kilns.

When the actual tag enclosing structure is exposed at such severe environments (heat, vibrations, shocks, contact with acids and solvents), the glass fiber paper breaks, letting the corrosive substances to enter into the plastic cylinder and damage the RFID chip.

In view of the above referred problem, applicant developed a RFID tag enclosing structure comprised of a ceramic fiber hardened on a resin having an external bell shaped cover made of vulcanized rubber, which is specially designed to withstand temperatures of up to 200° C. during a maximum time of 90 minutes, a maximum operational temperature (when read) of 130° C., water submersions at a maximum deep of 2 meters during a maximum time of 2 hours, contacts with alkaline acids at a pH between 4 and 13, contacts with solvents, severe vibrations having a maximum acceleration of 14.7 g, a frequency of 40 Hz in three directions for a maximum time of 3 hours, impacts at an acceleration of 6 g for 40 times minimum, a tension of 120 kg minimum and be flexed at 60 kg×cm.

SUMMARY OF THE INVENTION

It is therefore a main object of the present invention to provide a RFID tag enclosing structure which is comprised by a ceramic fiber hardened on a resin having an external bell shaped cover made of vulcanized rubber.

It is another main object of the present invention to provide a RFID tag enclosing structure of the above referred nature which can withstand severe industrial environments.

It is an additional object of the present invention to provide a RFID tag enclosing structure of the above referred nature which can withstand temperatures of up to 200° C. during a maximum time of 90 minutes, a maximum operational temperature (when read) of 130° C., water submersions at a maximum deep of 2 meters during a maximum time of 2 hours, contacts with alkaline acids at a pH between 4 and 13, contacts with solvents, severe vibrations having a maximum acceleration of 14.7 g, a frequency of 40 Hz in three directions for a maximum time of 3 hours, impacts at an acceleration of 6 g for 40 times minimum, a tension of 120 kg minimum and be flexed at 60 kg×cm.

These and other objects and advantages of the RFID tag enclosing structure of the present invention will become apparent to those persons having an ordinary skill in the art, from the following detailed description of the invention which will be made with reference to the accompanying drawings.

DETAILED DESCRIPTION OF THE INVENTION

Figure 1:
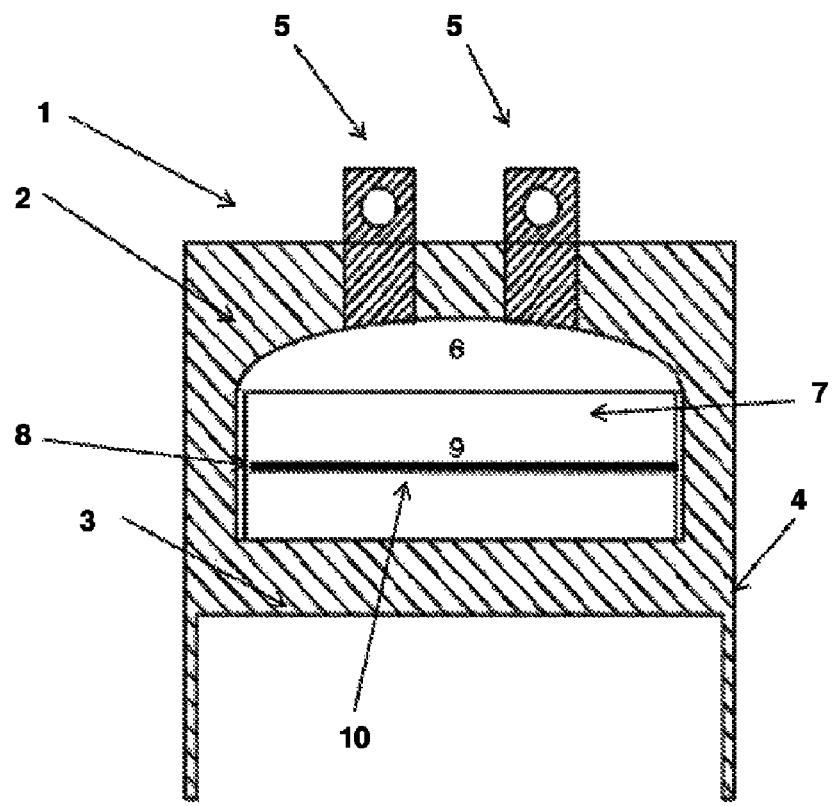
FIG. 1 is a view of the cross section of the RFID tag enclosing structure in accordance with a first embodiment thereof.
Figure 2:
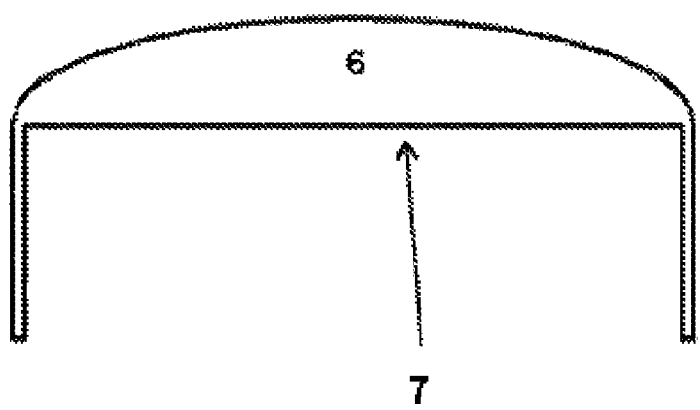
FIG. 2 is a view of the cross section of the hood of the RFID tag enclosing structure in accordance with a first embodiment thereof.
Figure 3:
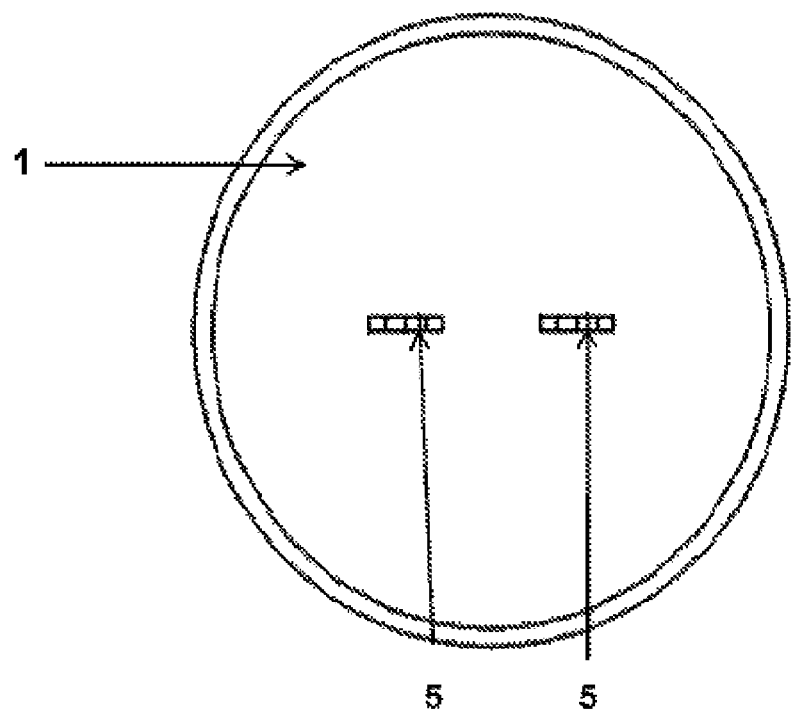
FIG. 3 is an upper view of the RFID tag enclosing structure in accordance with a first embodiment thereof.

The RFID tag enclosing structure of the present invention will be described making reference to the accompanying drawings and to a preferred embodiment.

In a preferred embodiment, the RFID tag enclosing structure comprises:
  a circular main body 1 made of a vulcanized thermoplastic elastomer comprising polysiloxane having an internal domed cylinder shaped housing 2 and an inferior open end (not shown) ending in an inferior open circular recess 3 having a circular wall 4;
  a pair of supports 5 integrated at a superior portion of the main body;
  a RFID tag encapsulator structure comprising:
    a hollow hood 6 having a domed cylinder shape, an internal open housing 7 and an inferior open end (not shown), said hood made of EPDM rubber adjusted inside the internal domed cylinder shaped housing 2 and completely surrounded by the main body 1 except by its inferior open end (nor shown), which faces the inferior open circular recess 3. The EPDM rubber material was selected without smoke charge in order to avoid interference when the RFID tag is read;
    a passive RFID tag 8 surrounded by a protective shell comprising
      a ceramic fiber paper (not shown) having a thickness of 0.25 inches, completely surrounding the passive tag inlay, which thermally protects the RFID tag from high temperatures to a maximum of 1260° C.;
      a thermoplastic elastomer layer (not shown) surrounding the ceramic fiber paper which is resistant to corrosion by acids and solvents, which can withstand a maximum temperature of 250° C. and which is resistant to flexion, shocks and tears;

a resin body 9 surrounding the thermoplastic elastomer except for the inferior portion of the RFID tag, where the passive RFID tag antenna 10 is located, which provides mechanic strength to the protective shell;

wherein the passive RFID tag 7 surrounded by the protective shell is located inside the hollow hood 6 and is completely surrounded by said hood 6 except for its inferior portion, where the passive RFID tag antenna 10 is located, facing the main body open inferior circular recess 3;

The circular wall 4 of the main body open inferior recess 3 protects the said open inferior recess 3 and the RFID tag antenna 10 from external agents, such as paint and corrosive substances, avoiding the antenna 10 to be covered by said substances and thus avoiding problems RFID tag reading problems.

The circular wall 4 of the main body open inferior recess 3 has a maximum width which correspond the diameter of the hood 6 plus 25% and a minimum length which is equal to the diameter of the hood 6.

In accordance with the above, the width of the circular wall 4 of the main body inferior open recess 3 may be calculated as follow:

$$TH\max = DTAG + DTAG(0.25)$$

$$TH\min = DTAG$$

Wherein: TH=width of the circular wall; DTAG=diameter of the hood.

During tests, the maximum reading range distance achieved between the antenna 10 and a RFID reader was 1.5 meters, including the tests using a RFID tag enclosing structure which has been submitted to a vehicle production process for over 10 times, and which thanks to the design of the main body open inferior recess 3, the paint and other substances cannot reach the superior portion of the main body open inferior recess 3.

The cylindrical domed shape of the RFID tag enclosing structure provides a high tolerance to impacts.

Figure 4:
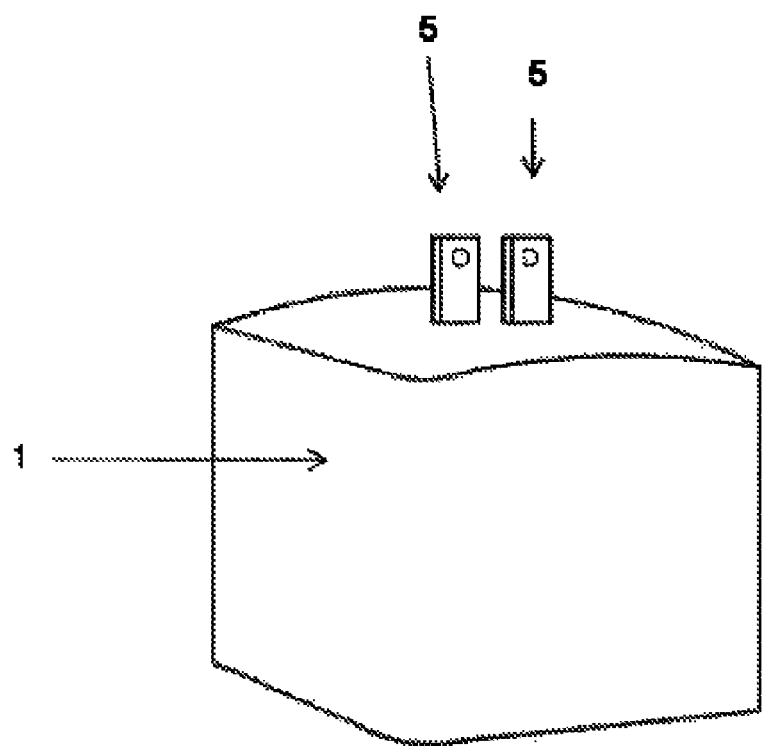
FIG. 4 is a perspective view of the RFID tag enclosing structure in accordance with a second embodiment thereof.
Figure 5:
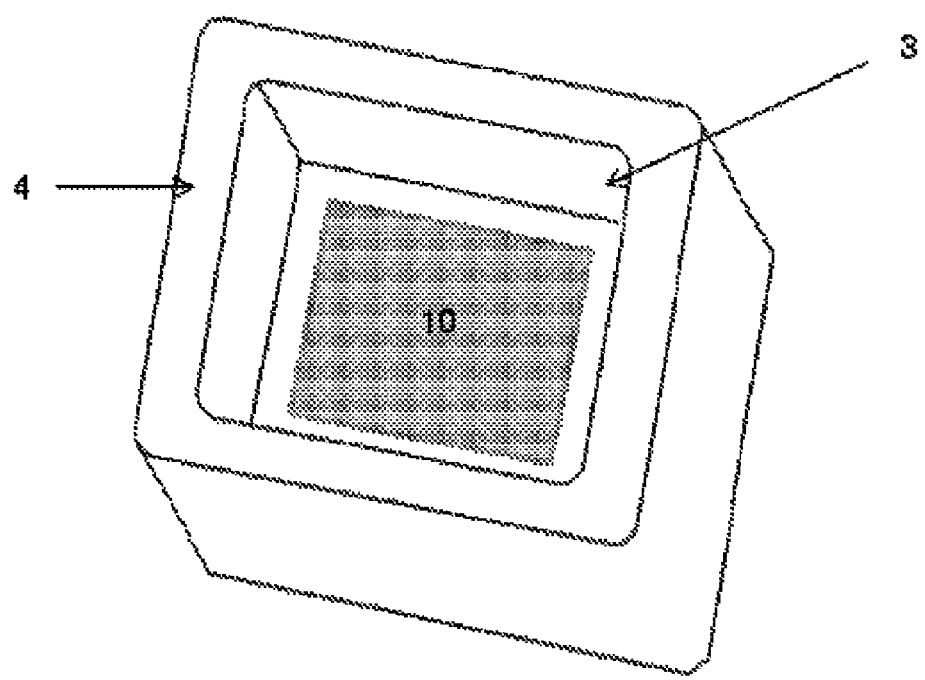
FIG. 5 is an inferior perspective view of the RFID tag enclosing structure in accordance with a second embodiment thereof.

In other embodiments, the main body 1 may have a quadrangular shape (or any other shape) (FIGS. 4 and 5) as well as its internal open housing 2 and its inferior open recess 3. In the same way the hollow hood and RFID tag protective shell may have a shape that conforms to the shape of the main body internal housing 2.

The tag enclosing structure may also be used to protect an active RFID tag.

The resistance properties of the RFID tag enclosing structure of the present invention are:
Maximum temperature resistance: 200° C. during 90 min.
Maximum internal operational temperature (when the RFID tag is being read) 130° C.
Maximum water resistance: deep of 2m during 2hours.
Resistance to acids and alkaline substances having a pH of between 4 to 13.
Solvent resistant.
Resistance to vibrations: maximum acceleration resistance 14.7 G, maximum frequency resistance 40 10 Hz, in 3 directions during 2 hours.
Resistance to impacts having an acceleration of 6G minimum for a maximum of 40 impacts.
Minimum tension resistance: 120Kg.
Flexion resistance: 60kg x cm.

Properties of the RFID tag enclosing structure materials.
Vulcanized Thermoplastic Elastomer (Polysiloxane)
The thermoplastic elastomers are a mix of a thermoplastic matrix with a vulcanized rubber.
General Characteristics;
Oil resistant
Low density
Traction resistant
Tear resistant
Resistant to fatigue by flexion
Abrasion resistant
High capacity to absorb fluids
Outdoor and aging resistant.
Specific Properties:
Shore hardness "A": 65.
Minimum tension resistance: 810 psi
Temperature resistance: between −40° C. to 250° C.
The original mechanical properties of the used vulcanized thermoplastic elastomer, was tested using the ASTM D-2240 and ASTM D-412 methods.
EPDM Rubber
The EPDM rubber is a thermo-polymer having good resistance to abrasion and wear. It is specially used for liquid sealing and has good dielectric properties, a good resistance to ambiental agents, acids, alkaline substances and to general known chemical products, but it is susceptible to be degraded by oils.
Specific Properties:
Shore hardness "A": 65.
Minimum tension resistance: 823 psi
Maximum elongation: 350%
Temperature resistance: between −20° C. to 170° C.
The mechanical properties of the used EPDM rubber was tested using the ASTM D-2240 and ASTM D-412 methods.
Ceramic Fiber
The ceramic fiber is a low thermal mass insulator made of aluminum silicate and has the following general characteristics:
Low weight.
Low kept heat.
Resistance to thermic shocks.
Thermally efficient.
Outdoor resistant.
Resistance to chemical attacks except to attacks by fluorhydric and phosphoric acids and concentrated alkalis.
Specific Properties:
Melting point: 3200° F. (1760° C.).
Maximum temperature resistance: 2300° F. (1260° C.).
Compounds (%):Al2O3 46.50%; SiO2 53.40%; Other 0.10%; LOI 6%.
Density lbs/ft3 (kg/m3): 10 (160).
Dielectric resistance: (Volts/mil): 50
Epoxic Resin The epoxy resin is a themostable polymer that hardens when mixed with a catalyst agent. The selected resin acts as an encapsulator for the RFID tag and protects it against humidity, short circuits, dust, chemical and thermal attacks. It is an excellent electric insulator.
When hardened, the epoxy resin gives the RFID tag mechanical strength and acts as a support for the hood walls. It further provides shape and hardness to the encapsulator.
In industrial environments, the encapsulator is required to have a mechanical strength that can withstand shocks and vibrations that could be present along an assembly line.
Specific Properties:
Dielectric rigidity: 100 Kv/cm 25 Kv/mm.
Resistivity: 10 to 10 Ohm/cm.
Dielectric constant: 3.2 to 3.7.

Density: 1.2
Arc resistance: 70 to 80 segs.
Distortion temperature (direct flame): 70 to 80° C.
Traction resistance: 480 Kg/cm2
Compression resistance: 680 Kg/cm$^2$.

The invention claimed is:
1. A RFID tag enclosing structure, comprising:
a main body made of a vulcanized thermoplastic elastomer having an internal housing ending in an open inferior recess having a surrounding wall protecting the open inferior recess; and
a RFID encapsulator structure completely surrounding a superior portion of the RFID tag, the RFID encapsulator structure comprising:
a hollow hood made of rubber, adjusted inside the main body internal housing having an internal open housing and an inferior open end facing the main body open inferior recess; and
a RFID tag surrounded by a protective shell, said protective shell comprising:
a ceramic fiber paper covering an RFID tag inlay;
a thermoplastic elastomer layer surrounding the ceramic fiber paper; and
a resin body surrounding the thermoplastic elastomer, except for the inferior portion of the RFID tag, where the passive RFID tag antenna is located, said resin body providing mechanical strength to the protective shell;
wherein the RFID tag surrounded by the RFID encapsulator structure is located inside the main body internal housing and wherein the antenna of the RFID tag faces the open inferior recess and is protected by the surrounding wall.

2. The RFID tag enclosing structure as claimed in claim 1, wherein:
the main body is made of a vulcanized thermoplastic elastomer comprising polysiloxane and has an internal domed cylinder shaped housing ending in an open inferior circular recess having a circular surrounding wall;
the hollow hood has a domed cylinder shape and is made of EPDM rubber wherein the rubber material is selected without smoke charge in order to avoid interference when the RFID tag is read; the RFID tag comprises a passive RFID tag;
the ceramic fiber paper has a thickness of 0.25 inches and which thermally protects the RFID tag from high temperatures to a maximum of 1260° C.;
the thermoplastic elastomer layer can withstand a maximum temperature of 250° C.; and
the circular wall of the main body open inferior recess has a maximum width which corresponds to a diameter of the hood plus 25% and a minimum length which is equal to the diameter of the hood.

3. The RFID tag enclosing structure as claimed in claim 1, wherein the resistance properties of the RFID tag enclosing structure are:
a maximum internal operational temperature of 130° C.;
a resistance to acids and alkaline substances having a ph of between 4 to 13;
a resistance to vibrations having a maximum acceleration of 14.7 G, a maximum frequency of 40 Hz in 3 directions for at least 2 hours;
a resistance to impacts having an acceleration of 6 G minimum for a maximum of 40 impacts;
a minimum tension resistance of 120 Kg; and
a flexion resistance of 60 kg x cm.

4. The RFID tag enclosing structure as claimed in claim 1, wherein the vulcanized thermoplastic elastomer has the following characteristics:
a Shore hardness "A" of 65;
a minimum tension resistance of 810 psi; and
a resistance to temperatures between 40° C. to 250° C.

5. The RFID tag enclosing structure as claimed in claim 1, wherein the hollow hood is made of EPDM rubber having the following characteristics:
a Shore hardness "A" of 65;
minimum tension resistance of 823 psi;
a maximum elongation of 350%; and
a resistance to temperatures between −20° C. to 170° C.

6. The RFID tag enclosing structure as claimed in claim 1, wherein the ceramic fiber has the following characteristics:
a melting point of 1760° C.;
a maximum temperature resistance of 1260° C.;
a density of 160 kg/m$^3$; and
a dielectric resistance of 50 volts/mil.

7. A RFID tag enclosing structure as claimed in claim 1, wherein the resin body is made of an epoxy resin having the following properties:
a dielectric rigidity of 100 Kv/cm;
a dielectric constant of from 3.2 to 3.7;
an arc resistance of from 70 to 80 segs;
a distortion temperature of from 70 to 80° C.;
a traction resistance of 480 Kg/cm2; and
a compression resistance: of 680 Kg/cm$^2$.

8. The RFID tag enclosing structure as claimed in claim 1, wherein the surrounding wall protecting the open inferior recess is a circular wall having a width calculated as follows:

$$TH_{max}=DTAG+DTAG(0.25)$$

$$TH_{min}=DTAG$$

where TH is the width of the circular wall and DTAG is a diameter of the hood.

* * * * *